(12) United States Patent
Nakatani et al.

(10) Patent No.: US 6,984,572 B2
(45) Date of Patent: Jan. 10, 2006

(54) METHOD FOR MANUFACTURING ELECTRONIC COMPONENT

(75) Inventors: Masaya Nakatani, Hyogo (JP);
Michihiko Hayashi, Fukui (JP);
Hirofumi Tajika, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 118 days.

(21) Appl. No.: 10/473,980

(22) PCT Filed: Jan. 24, 2003

(86) PCT No.: PCT/JP03/00637

§ 371 (c)(1),
(2), (4) Date: Oct. 3, 2003

(87) PCT Pub. No.: WO03/063219

PCT Pub. Date: Jul. 31, 2003

(65) Prior Publication Data

US 2004/0132310 A1    Jul. 8, 2004

(30) Foreign Application Priority Data

Jan. 25, 2002 (JP) .............................. 2002-016553
Feb. 20, 2002 (JP) .............................. 2002-043018

(51) Int. Cl.
*H01L 21/301* (2006.01)

(52) U.S. Cl. ...................... 438/460; 438/113
(58) Field of Classification Search ........ 438/460–464, 438/700–706

See application file for complete search history.

(56) References Cited

U.S. PATENT DOCUMENTS 5,972,781 A * 10/1999 Wegleiter et al. ........... 438/460
6,569,343 B1 * 5/2003 Suzuki et al. ................. 216/27

FOREIGN PATENT DOCUMENTS

| JP | 53-46270 | 4/1978 |
|---|---|---|
| JP | 61-187238 | 8/1986 |
| JP | 2-273955 | 11/1990 |
| JP | 6-208976 | 7/1994 |
| JP | 7-22358 | 1/1995 |
| JP | 9-7973 | 1/1997 |
| JP | 11-67699 | 3/1999 |
| JP | 2000-306887 | 11/2000 |
| JP | 2001-326206 | 11/2001 |
| JP | 2002-16021 | 1/2002 |

* cited by examiner

*Primary Examiner*—Dung A. Le
(74) *Attorney, Agent, or Firm*—Wenderoth, Lind & Ponack, L.L.P.

(57) ABSTRACT

An electronic circuit is manufactured by the following method. Elements are formed on a front surface of a substrate, and then, a recess is formed around each of the elements in the front surface of the substrate. Then, a portion of the substrate is removed from a back surface of the substrate until reaching the bottom of the recess. In the method, the elements are separated at once by removing the portion of the substrate from the back surface, and thus, the elements are manufactured efficiently.

26 Claims, 21 Drawing Sheets

US 6,984,572 B2

METHOD FOR MANUFACTURING ELECTRONIC COMPONENT

This application is a 371 of PCT/JP03/00637 Jan. 24, 2003.

FIELD OF THE INVENTION

The present invention relates to a method of manufacturing an electronic device including an electronic element formed on a planar substrate, such as a silicone substrate or a glass substrate.

BACKGROUND OF THE INVENTION

An electronic device is generally manufactured by forming layers of metal, dielectric, and semiconductor materials on a planar substrate, such as a silicon substrate or a glass substrate sequentially and by patterning the layers. Plural electronic elements are formed simultaneously on the substrate. Then, conventionally, the substrate is divided into chips including electronic elements by, e.g., a dicing blade, respectively. The electronic elements are separated, thus causing the device to be manufactured at a low productivity.

SUMMARY OF THE INVENTION

An electronic circuit is manufactured by the following method. An element is formed on a front surface of a substrate, and a recess is provided around the element in the front surface of the substrate. A portion of the substrate is removed from the back surface of the substrate until reaching the recess.

In the method, the elements are separated simultaneously by removing a portion of the substrate from the back surface of the substrate, thus improving efficiency of the production of the device.

DETAILED DESCRIPTION OF THE PREFERRED EMBODIMENTS

Figure 1:
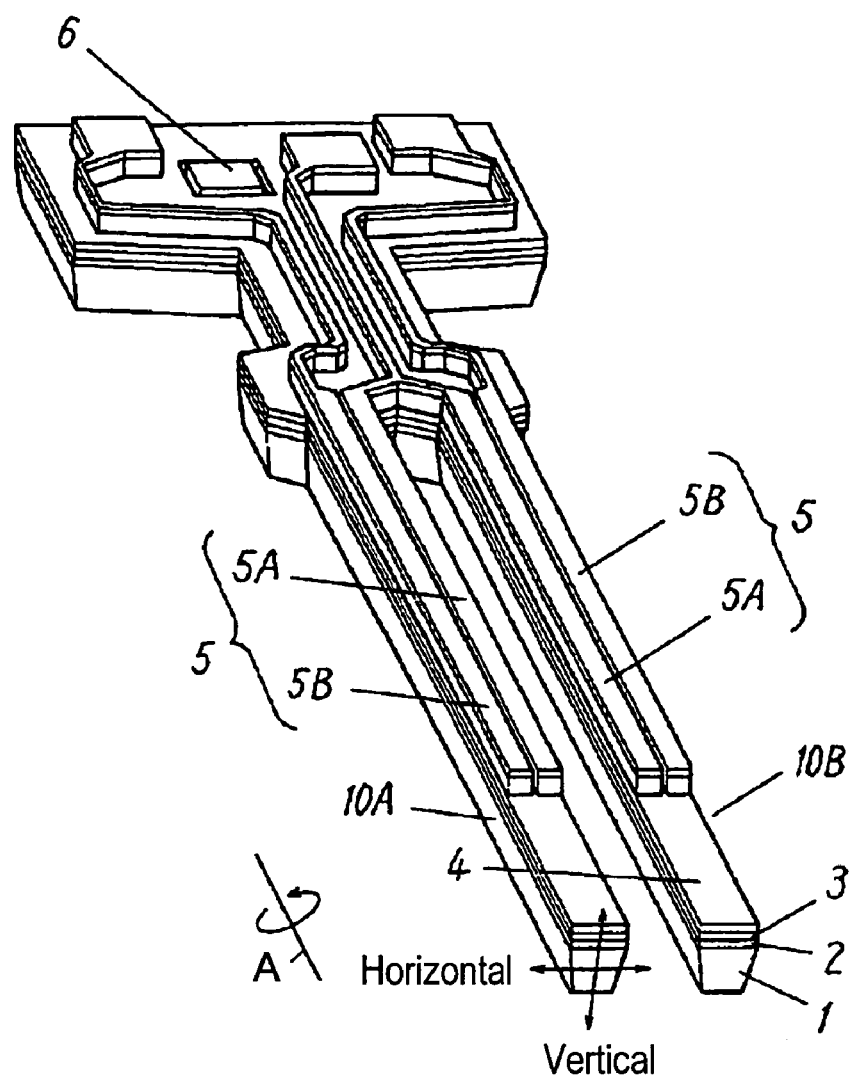
FIG. 1 is a perspective view of an angular rate sensor according to exemplary embodiments of the present invention.
Figure 2:
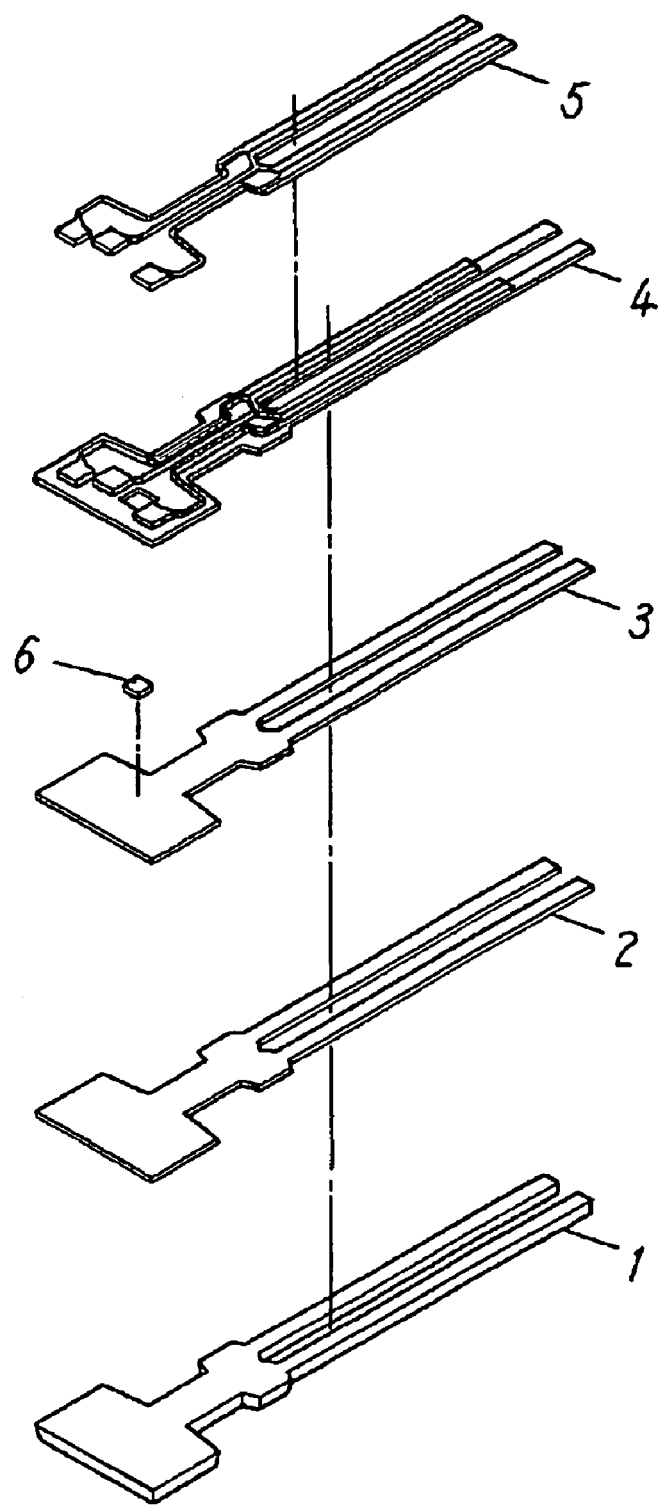
FIG. 2 is an exploded perspective view of the angular rate sensor according to the embodiments.

FIG. 1 is a perspective view of an angular rate sensor as an electronic element according to exemplary embodiments of the present invention. FIG. 2 is an exploded perspective view of the element. A buffer layer 2, a lower electrode layer 3, a piezoelectric layer 4, an upper electrode layer 5, and an auxiliary electrode 6 are provided in a sequence on a substrate 1 having a tuning fork shape.

An operation of the angular rate sensor for detecting an angular rate will be explained briefly with reference to FIGS. 1 and 2. The upper electrode layer 5 consists of an oscillator electrode 5A and a detector electrode 5B which face the piezoelectric layer 4 across the lower electrode 3. Upon a voltage being applied between the oscillator electrode 5A and the lower electrode 3, the piezoelectric layer 4 provided between the oscillator electrode 5A and the lower electrode 3 expands and contracts to deflect arms 10A and 10B of the substrate 1, hence triggering an oscillation of the tuning fork in a lateral direction. When an angular rate is generated about axis A extending in parallel to the arms of the tuning fork, the arms 10A and 10B deflect in a direction perpendicular to the axis A and the direction of the oscillation. The deflection generates an electrical charge in the piezoelectric layer 4 according to the amount of the deflection. The electric charge is then measured through the detector electrode 5B and translated into the angular rate.

(Exemplary Embodiment 1)

Figure 3:
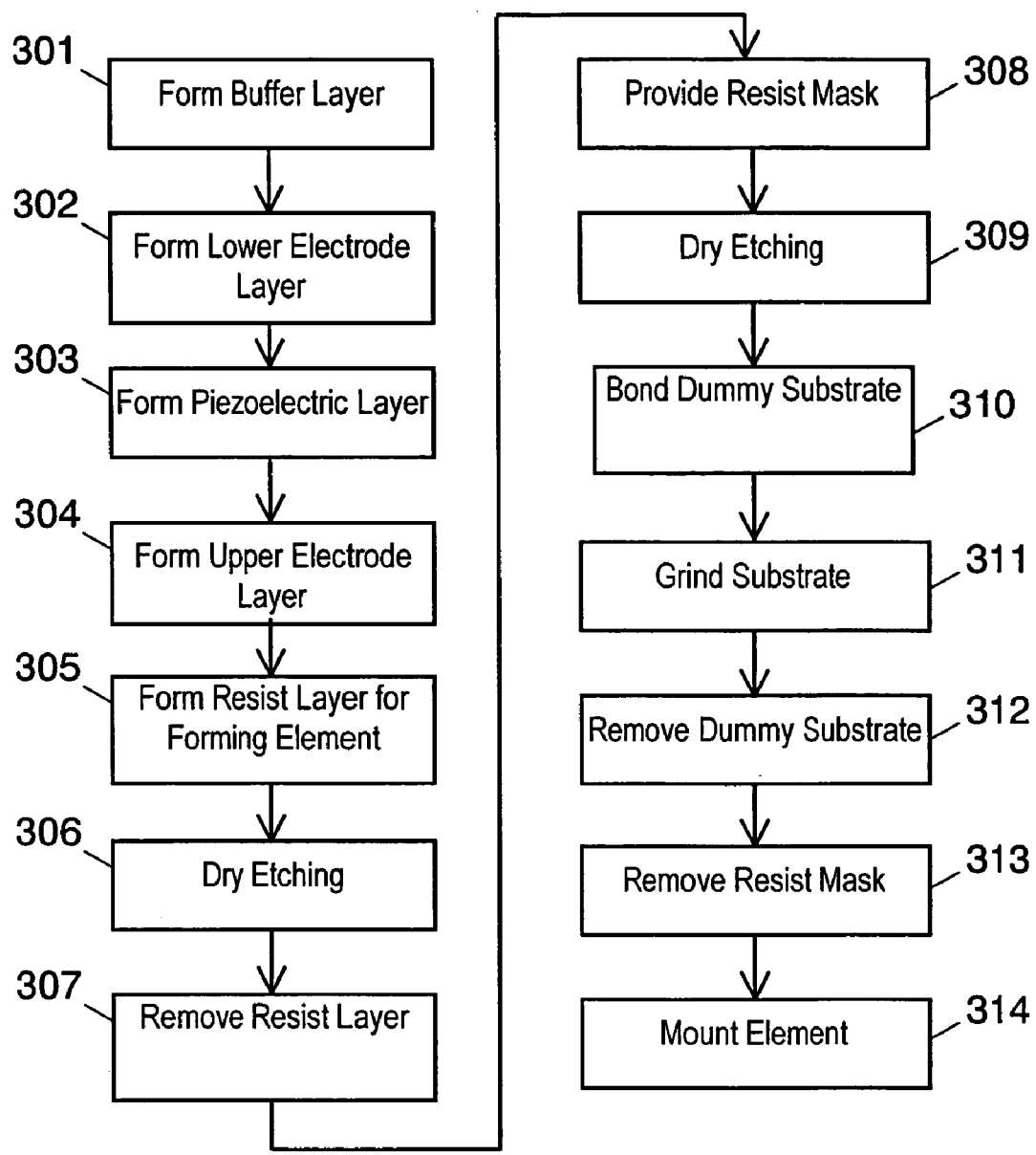
FIG. 3 is a flowchart for showing processes of manufacturing the angular rate sensor of Exemplary Embodiment 1.

A method of manufacturing an angular rate sensor according to Exemplary Embodiment 1 of the present invention will be described with reference to FIGS. 3 to 20. FIG. 3 is a flowchart of the method of manufacturing the angular rate sensor, and FIGS. 4 to 20 are cross sectional views and perspective views for showing the method.

Figure 4:
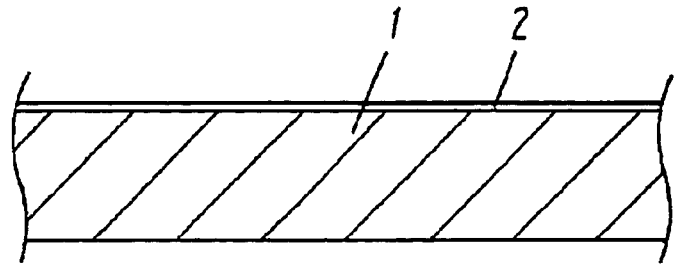
FIG. 4 is a cross sectional view of the sensor for showing a process of manufacturing the sensor of Embodiment 1.

As shown in FIG. 4, a buffer layer 2 made of one of nickel oxide, cobalt oxide, magnesium oxide, and titanium is formed on the substrate 1 by a metal-organic chemical vapor deposition (MOCVD) method (Step 301 in FIG. 3). For example, the buffer layer 2 of nickel oxide may be formed with gas of sublimated nickel acetyl acetonate. The buffer layer 2 of titanium may be formed by sputtering.

Figure 5:
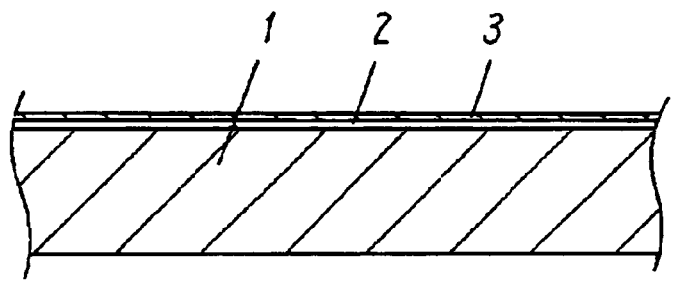
FIG. 5 is a cross sectional view of the sensor for showing a process of manufacturing the sensor of Embodiment 1.

Then, a lower electrode layer 3 of platinum is formed on the buffer layer 2 by sputtering or vacuum vapor deposition, as shown in FIG. 5 (Step 302 in FIG. 3).

Figure 6:
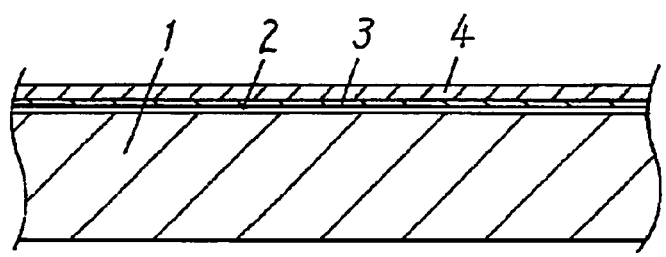
FIG. 6 is a cross sectional view of the sensor for showing a process of manufacturing the sensor of Embodiment 1.

Then, a piezoelectric layer 4 of piezoelectric material, such as lead zirconium titanate (PZT), is formed on the lower electrode layer 3 by sputtering or vacuum vapor deposition, as shown in FIG. 6 (Step 303 in FIG. 3).

Figure 7:
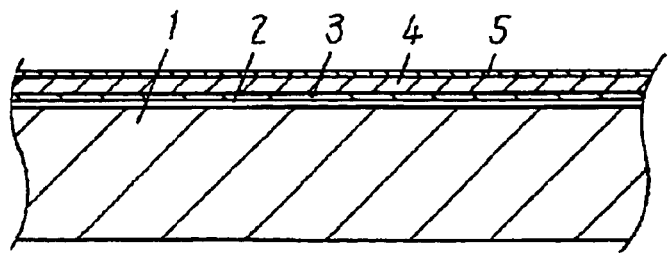
FIG. 7 is a cross sectional view of the sensor for showing a process of manufacturing the sensor of Embodiment 1.

Then, as shown in FIG. 7, an upper electrode layer 5 of gold is formed on the piezoelectric layer 4 by sputtering or vacuum vapor deposition (Step 304 in FIG. 3). Alternatively, a layer of titanium or chrome may be provided between the piezoelectric layer 4 of PZT and the upper electrode layer 5 of gold. Since titanium and chrome are adhesive to the PZT layer and have affinity with gold to develop a diffusion layer, the layer increases a bonding strength between the piezoelectric layer 4 and the upper electrode layer 5. According to an experiment conducted by applicants, the titanium layer having a thickness ranging from 20 to 100 angstroms increases the bonding strength satisfactorily.

FIGS. 8 to 16 are cross sectional views of the arms 10A and 10B of the sensor.

Figure 8:
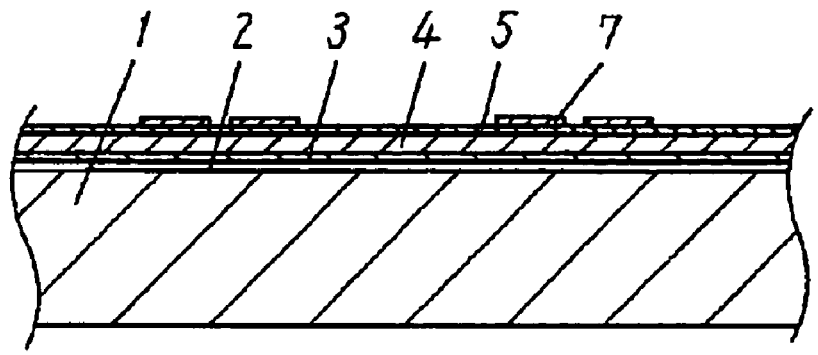
FIG. 8 is a cross sectional view of the sensor for showing a process of manufacturing the sensor of Embodiment 1.

As shown in FIG. 8, a resist film 7 of photosensitive resin material for patterning the element is provided by a photolithography method for patterning the oscillator electrode 5A and the detector electrode 5B of the upper electrode 5 (Step 305 in FIG. 3).

Figure 9:
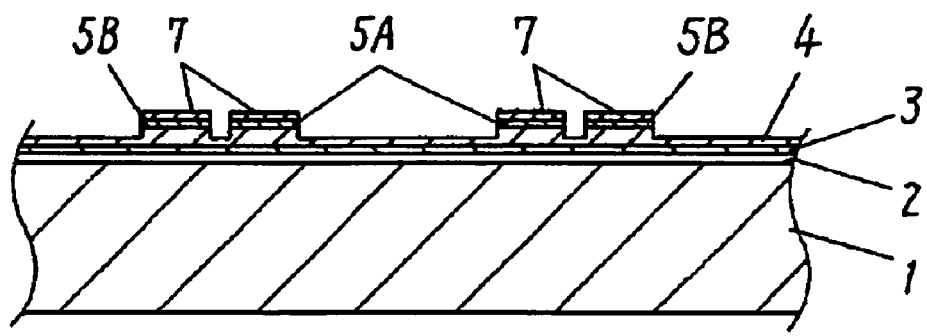
FIG. 9 is a cross sectional view of the sensor for showing a process of manufacturing the sensor of Embodiment 1.

Then, as shown in FIG. 9, portions of the upper electrode layer 5 and the piezoelectric layer 4 which are not covered with the resist film 7 are removed by dry-etching to provide the oscillator electrode 5A and the detector electrode 5B (Step 306 in FIG. 3). The dry-etching terminates just before reaching the bottom of the piezoelectric layer 4 for preventing an interface between the lower electrode layer 3 and the piezoelectric layer 4 from being assaulted by remover solvent used for removing the resist film 7 in the succeeding process.

Figure 10:
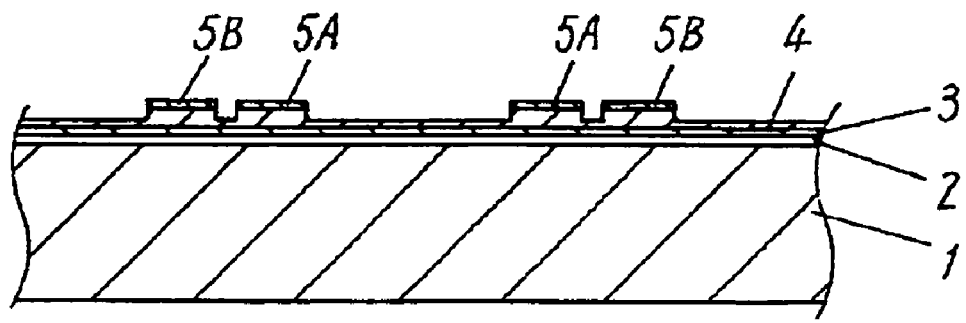
FIG. 10 is a cross sectional view of the sensor for showing a process of manufacturing the sensor of Embodiment 1.

Then, as shown in FIG. 10, the resist film 7 is removed with organic or alkali remover solvent or by oxygen ashing (Step 307 in FIG. 3). As a result, the upper electrode 5 is separated into the oscillator electrode 5A and the detector electrode 5B.

Figure 11:
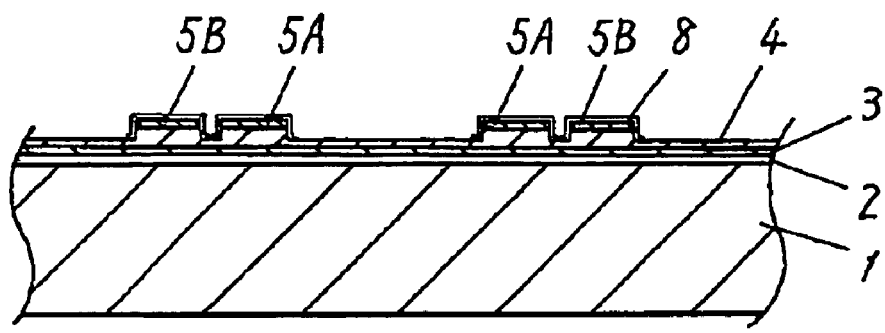
FIG. 11 is a cross sectional view of the sensor for showing a process of manufacturing the sensor of Embodiment 1.

Next, as shown in FIG. 11, a resist mask 8 is provided similarly to the resist film 7 for covering the oscillator electrode 5A, the detector electrode 5B, and regions of the piezoelectric layer 4 neighboring the electrodes (Step 308 in FIG. 3).

Figure 12:
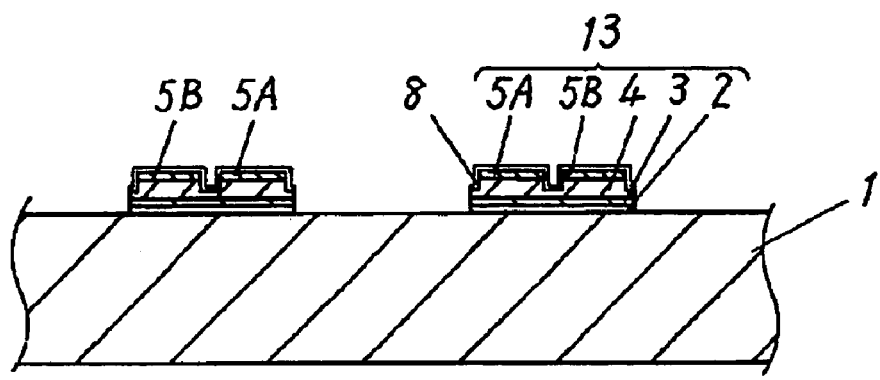
FIG. 12 is a cross sectional view of the sensor for showing a process of manufacturing the sensor of Embodiment 1.

Then, as shown in FIG. 12, portions of the piezoelectric layer 4, the lower electrode 3, and the buffer layer 2 which are not covered with the resist mask 8 are dry-etched (Step 309 in FIG. 3). The resist mask 8 is provided around each electronic element 13 and is spaced from other resist masks 8 neighboring electronic elements 13, thus allowing the electronic elements 13 to be isolated from each other.

Further, the substrate 1 is dry-etched with plural types of gas. The types of gas are different from each other in etching condition. For example, a first gas of $SF_6$ for facilitating the etching and a second gas of $C_4F_8$ for suppressing the etching are used. The substrate 1 is etched with mixture of the two types of gas or with each type of gas alternately.

The mixture of the types of the gas controls facilitating and suppressing the etching by changing the ratio of the types of gas during the etching, thus controlling an amount of the etching of the substrate 1. The ratio appropriately determined allows the substrate 1 to be etched in a direction perpendicular to a surface of the substrate, thus allowing a recess 9 to have side walls and a bottom substantially perpendicular to the side walls. When the ratio of the first gas is increased, the bottom and each side wall of the recess 9 in the substrate 1 can form an acute angle between the bottom and each side wall of the recess 9.

When the two types of gas are used alternately, the shape of the etched recess 9 in the substrate 1 can favorably be adjusted by controlling the ratio of respective durations of the usage of the types of gas.

Figure 13:
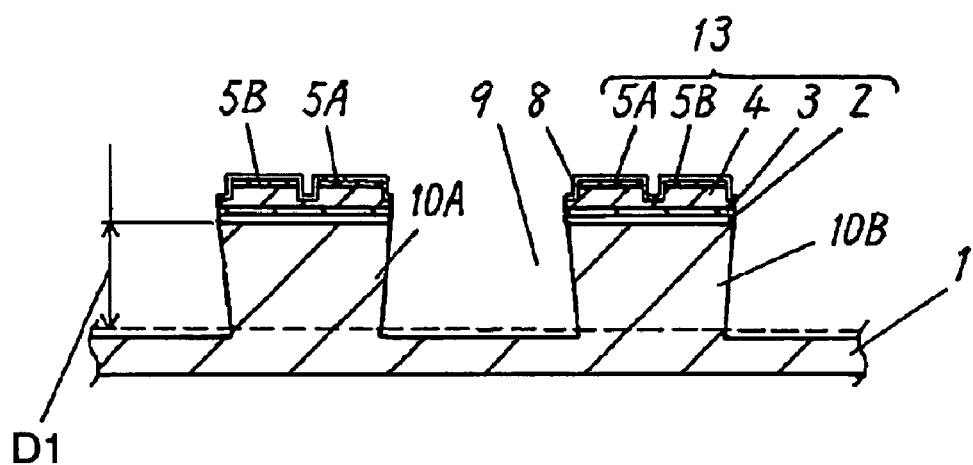
FIG. 13 is a cross sectional view of the sensor for showing a process of manufacturing the sensor of Embodiment 1.

The substrate 1 is etched up to a depth greater than a necessary thickness D1 of the substrate 1. As shown in FIG. 13, the substrate 1 has a cross section of a trapezoidal shape. In the cross section, a width far from a surface where the lower electrode layer 3, the piezoelectric layer 4, and the upper electrode layer 5 are provided is smaller than a side where the electrodes are provided.

Figure 14:
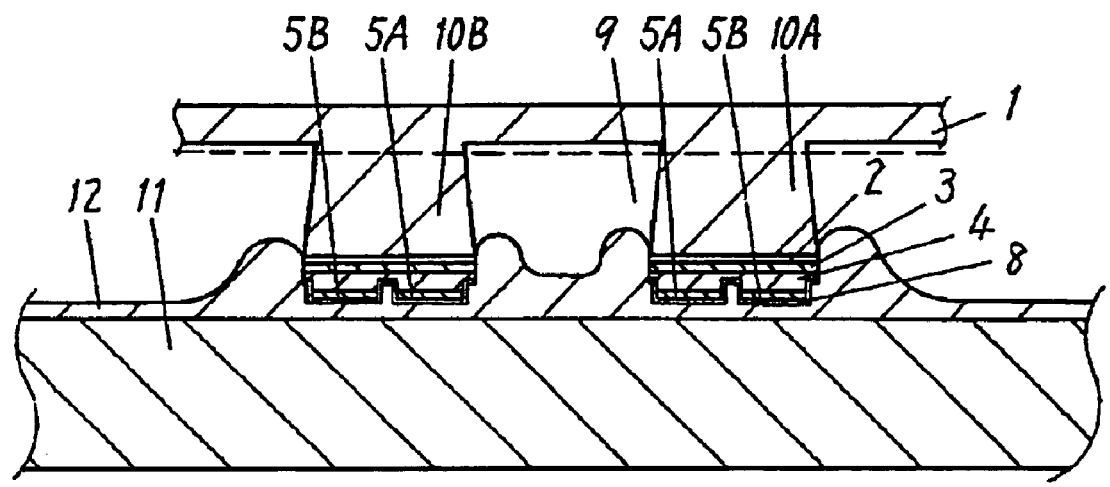
FIG. 14 is a cross sectional view of the sensor for showing a process of manufacturing the sensor of Embodiment 1.

Then, the substrate 1 is bonded to a dummy substrate 11 by an adhesive layer 12 while having the resist mask 8, as shown in FIG. 14 (Step 310 in FIG. 3). The resist mask 8 may be removed before the bonding of the substrate.

The adhesive layer 12 covers at least the upper surface and the side surface of the electronic element 13. The adhesive layer 12 is applied abundantly enough to enter into the recess 9 between the arms 10A and 10B of the tuning fork. The adhesive layer 12 accordingly holds the arms 10A and 10B securely upon being cured, and thus, increases bonding strength as shown in FIG. 14. Displacement of the sensor against the dummy substrate 11 is accordingly avoided while the substrate 1 is being ground, and thus, the substrate 1 is ground uniformly.

FIG. 14 illustrates the single electronic element. However the dummy substrate 11 is bonded to plural electronic elements with the substrate 1 by the adhesive layer 12.

The dummy substrate 11 has a planar surface and a physical strength sufficient to withstand a certain mechanical stress caused by removing the substrate 1. For example, the dummy substrate 11 may be made of glass, silicon, or SUS material.

Figure 15:
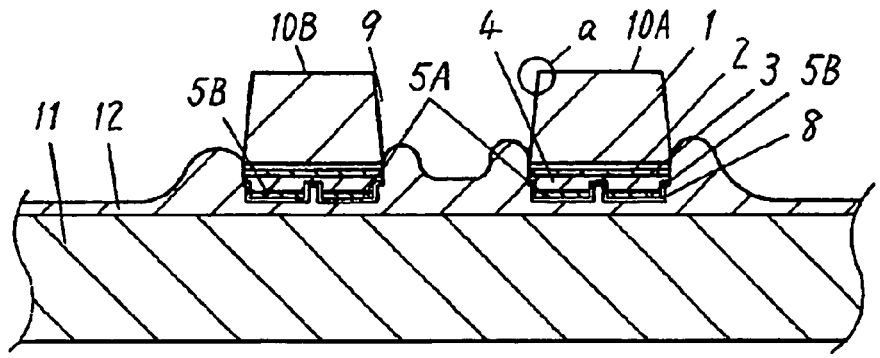
FIG. 15 is a cross sectional view of the sensor for showing a process of manufacturing the sensor of Embodiment 1.

Then, a portion of the substrate 1 is ground off from a back surface of the substrate 1, as shown in FIG. 15 (Step 311 in FIG. 3). The grinding can control the thickness of the substrate 1 precisely. More specifically, the substrate 1 is grounded off up to a depth larger than the necessary thickness, as shown in FIG. 13. The grinding permits the etching process of the upper electrode layer 5, the piezoelectric layer 4, the lower electrode layer 3, the buffer layer 2, and the substrate 1 while the substrate 1 is thick as being stressed by external force during the production. Accordingly, since the substrate 1 is protected from breakage, the sensor can be manufactured efficiently.

Figure 18:
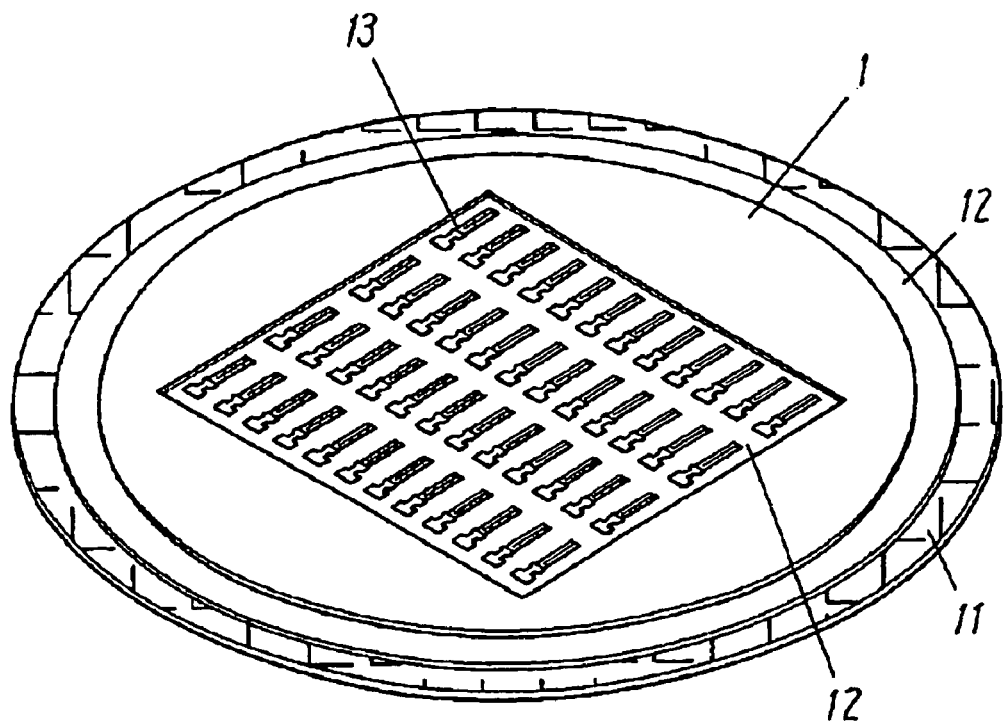
FIG. 18 is a perspective view of the sensor for showing a process of manufacturing the sensor of Embodiment 1.

The substrate 1 is ground off to have the necessary depth after the recess 9 communicates with another recess. The electronic elements 13 have the upper and side surfaces secured with the dummy substrate 11 by the adhesive layer 12. Accordingly, as shown in FIG. 18, the electronic elements 13 are held together after the substrate 1 is ground off to be separated into chips.

The substrate 1 has the cross section of the trapezoidal shape having a ground side narrower than a side opposite to the ground side. This shape protects the substrate 1 from being chipped off at a corner (the portion "a" in FIG. 15) between the top surface and the side wall at the recess 9 even when the substrate is ground after the recess 9 communicates with another recess.

Figure 19:
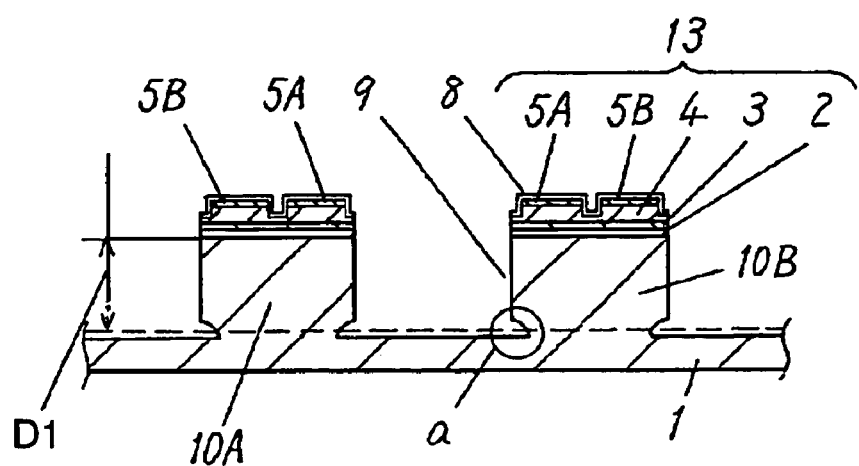
FIG. 19 is a cross sectional view of the sensor for showing a process of manufacturing the sensor of Embodiment 1.

The trapezoidal cross section of the substrate 1 may be etched as shown in FIG. 19 if the shape influences a frequency response of the sensor. First, the substrate 1 is etched downward, i.e., perpendicularly to the top surface of the substrate. When the substrate 1 is etched just before the necessary depth Dl, an etching condition is changed for having the substrate etched towards the side wall of the substrate (the portion "a" in FIG. 19). The etching of the substrate 1 protects the substrate 1 from being chipped off at the corner (the portion "a" in FIG. 19) between the top surface and the side wall of the recess 9, and allows most of the substrate 1 to have the side walls perpendicular to the top surface even when the recess 9 communicates with another recess by the grinding of the substrate 1 The substrate 1 may be etched towards the side wall with etching gas of xenon difluoride. The gas allows the recess 9 to be widened at the bottom as shown in the portion "a" in FIG. 19. During the etching with the xenon gas, the side walls of the substrate 1 are protected with a protective coating developed by the preceding etching with the first and second gases. Since the bottom of the substrate 1 is not covered with the protective coating, the bottom can further be etched with the etching gas of xenon difluoride.

Figure 16:
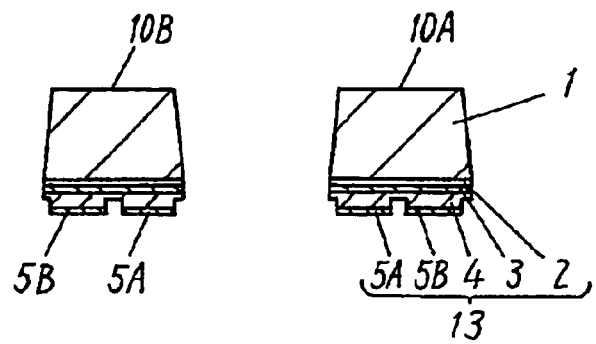
FIG. 16 is a cross sectional view of the sensor for showing a process of manufacturing the sensor of Embodiment 1.
Figure 17:
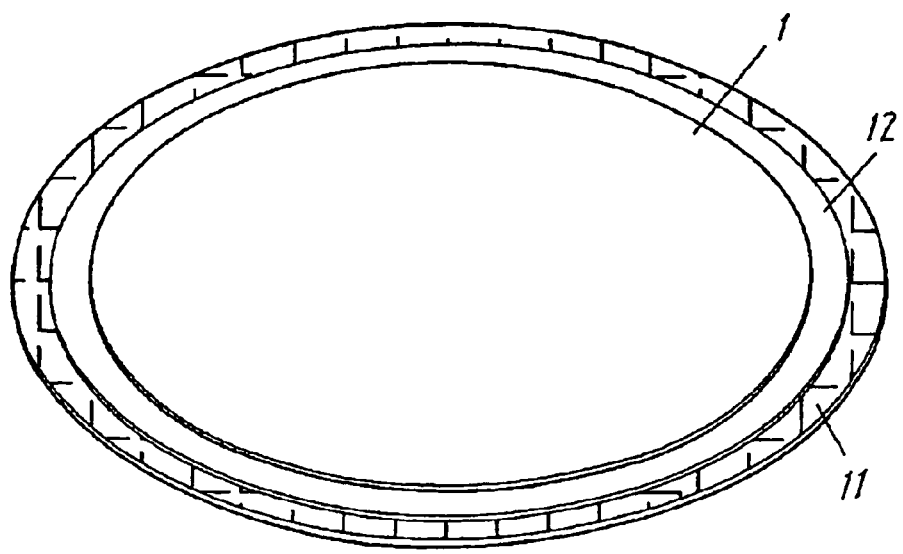
FIG. 17 is a perspective view of the sensor for showing a process of manufacturing the sensor of Embodiment 1.

Then, as shown in FIG. 16, the dummy substrate 11 is removed (Step 312 in FIG. 3), and the resist mask 8 is removed similarly to the resist film 7 (Step 313 in FIG. 3), thus providing an angular rate sensor 15. At this moment, if necessary, a remaining portion of the adhesive layer 12 may be removed from the electronic element 13. Since the resist mask 8 is isolated from other electronic elements 13, the electronic element 13 is connected to adjacent electronic devices 13 only through the adhesive layer 12 and the dummy substrate 11. This arrangement allows the electronic elements 13 to be separated from each other by just removing the adhesive layer 12. The upper electrode layer 5 consisting of the oscillator electrode 5A and the detector electrode 5B is covered with the resist mask 8 before the separation of the electronic elements 13, thus being protected from injury and pollution.

Figure 20:
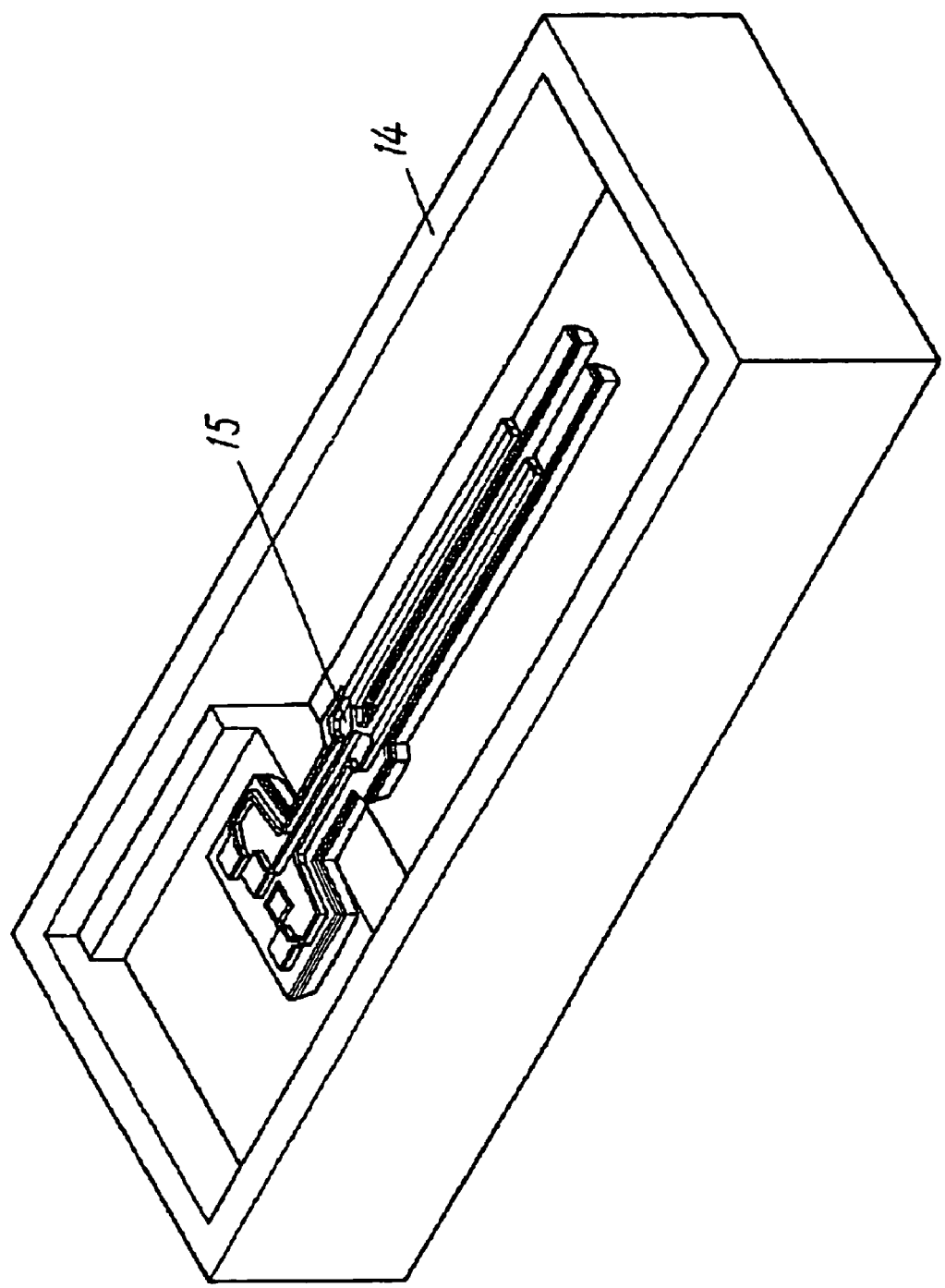
FIG. 20 is a perspective view of the angular rate sensor according to manufacturing the sensor of Embodiment 1.

Then, as shown in FIG. 20, the angular rate sensor is accommodated in a case 14 according to requirement (Step 314 in FIG. 3).

The electronic device of Embodiment 1 is not limited to the angular rate sensor but may be any other device, such as a chip resistor, a chip oscillator, or a chip actuator, with equal effects.

(Exemplary Embodiment 2)

Figure 21:
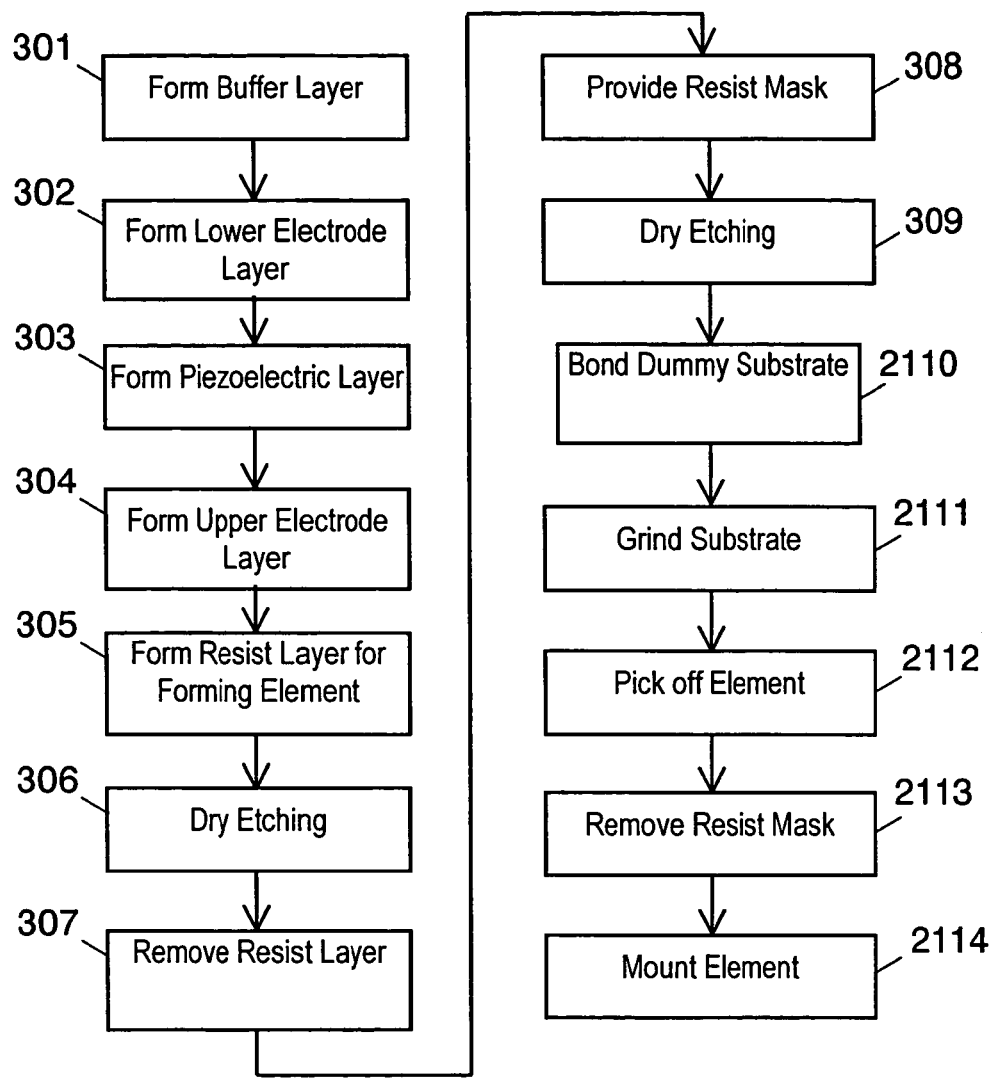
FIG. 21 is a flowchart for showing processes of manufacturing an angular rate sensor according to Exemplary Embodiment 2.

FIG. 21 is a flowchart for showing a method of manufacturing an angular rate sensor according to Exemplary Embodiment 2 of the present invention. FIGS. 22 to 29 are cross sectional views and perspective views of the sensor for showing processes in the method.

In the method of Embodiment 2, the sensor is manufactured by Steps 301 to 309 of Embodiment 1 shown in FIG. 3 until a substrate 1 is to be dry-etched, as shown in FIG. 21 (Step 309).

Figure 22:
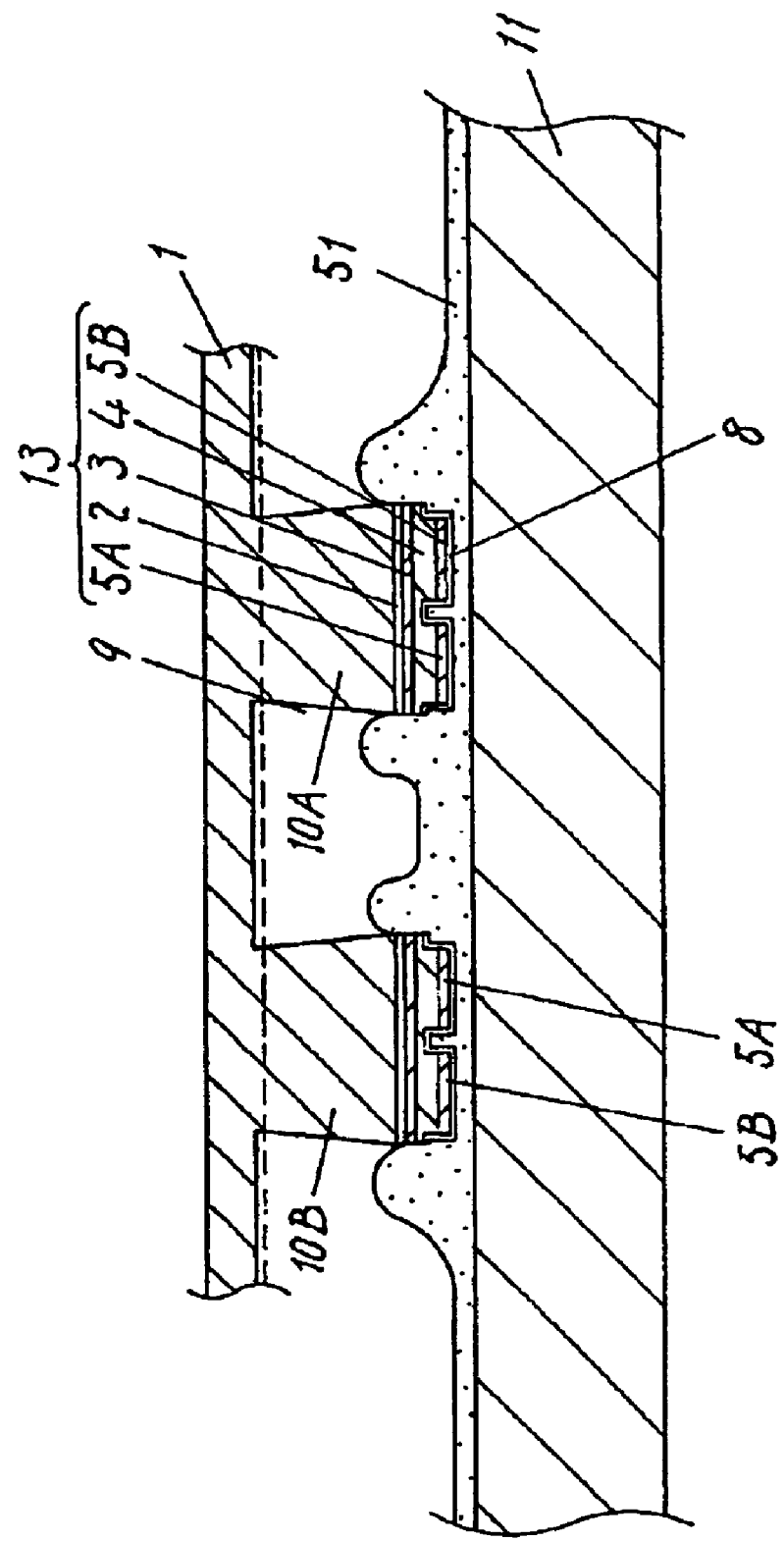
FIG. 22 is a cross sectional view of the sensor for showing a process of manufacturing the sensor of Embodiment 2.

Then, as shown in FIG. 22, the substrate 1 having the resist mask 8 attached to the substrate is bonded to the dummy substrate 11 by an adhesive layer 51 made of thermoplastic resin, such as paraffin wax used in candles (Step 2110 in FIG. 21). The resist mask 8 may be removed before this process. An amount of adhesive for forming the adhesive layer 51 may be determined similarly to that of Embodiment 1.

Figure 23:
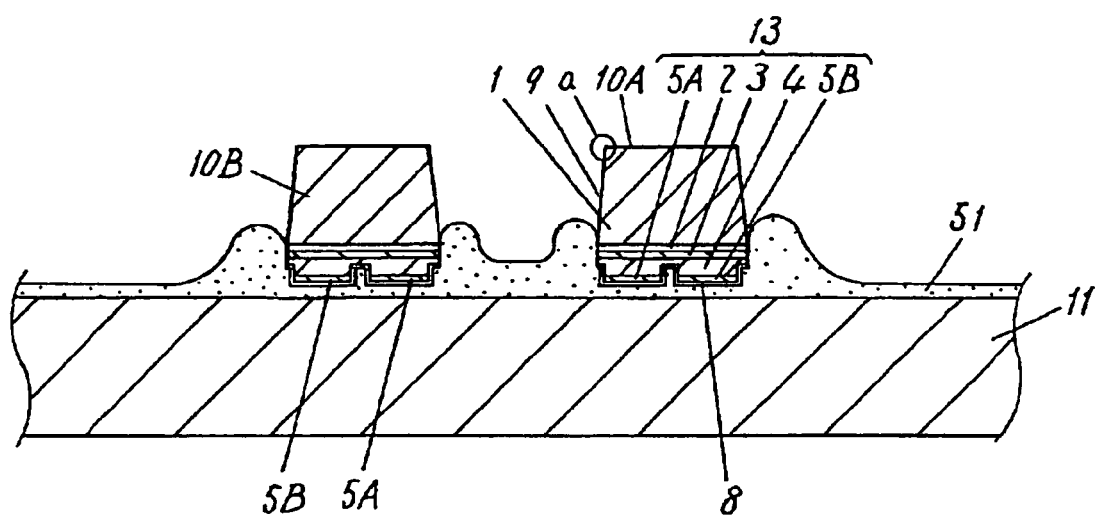
FIG. 23 is a cross sectional view of the sensor for showing a process of manufacturing the sensor of Embodiment 2.
Figure 24:
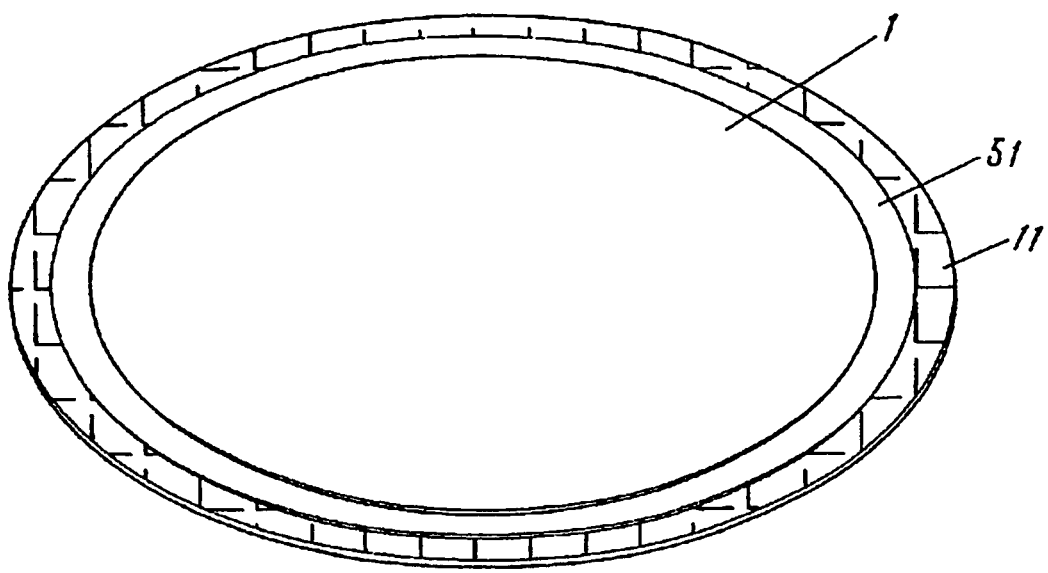
FIG. 24 is a perspective view of the sensor for showing a process of manufacturing the sensor of Embodiment 2.

FIG. 23 illustrates the single electronic element. As shown in FIG. 24, in practice, a surface of the substrate 1 where the electronic elements are provided faces the dummy substrate 11 and is bonded to the dummy substrate 11 by the adhesive layer 51.

Figure 25:
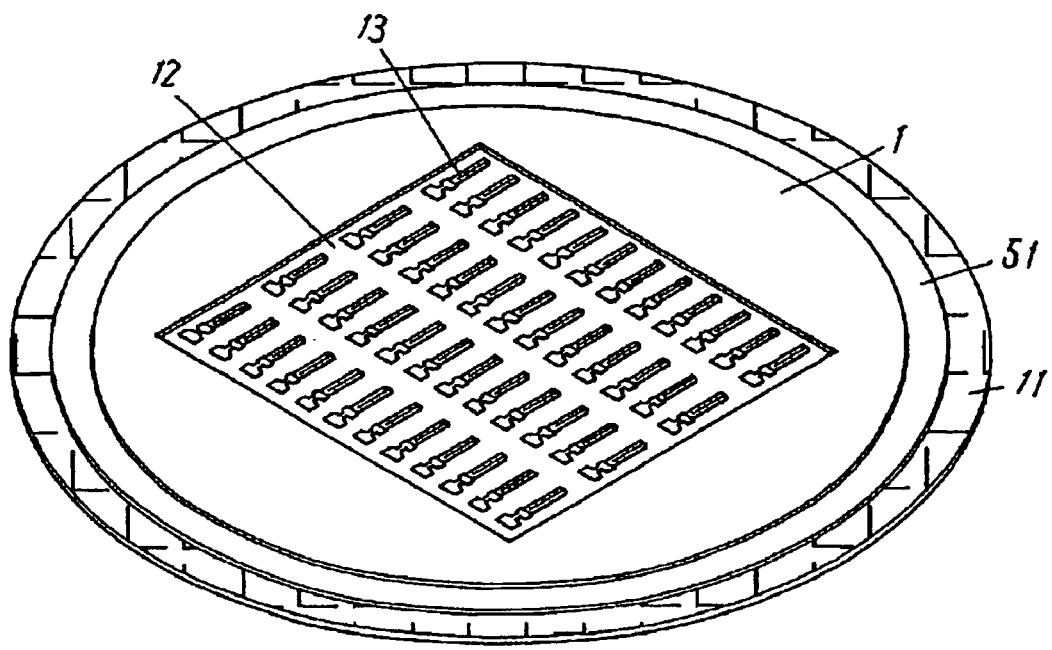
FIG. 25 is a perspective view of the sensor for showing a process of manufacturing the sensor of Embodiment 2.

Then, as shown in FIGS. 23 and 25, a portion of the substrate 1 is removed similarly to Step 311 in FIG. 3 of Embodiment 1 (Step 2111 in FIG. 21).

The electronic element 13 is then heated and picked off from the adhesive layer 51 (Step 2112 in FIG. 21). As the thermoplastic resin is softened by the heating of the electronic device 13, the adhesive layer 51 allows the electronic element 13 to be separated easily.

Figure 26:
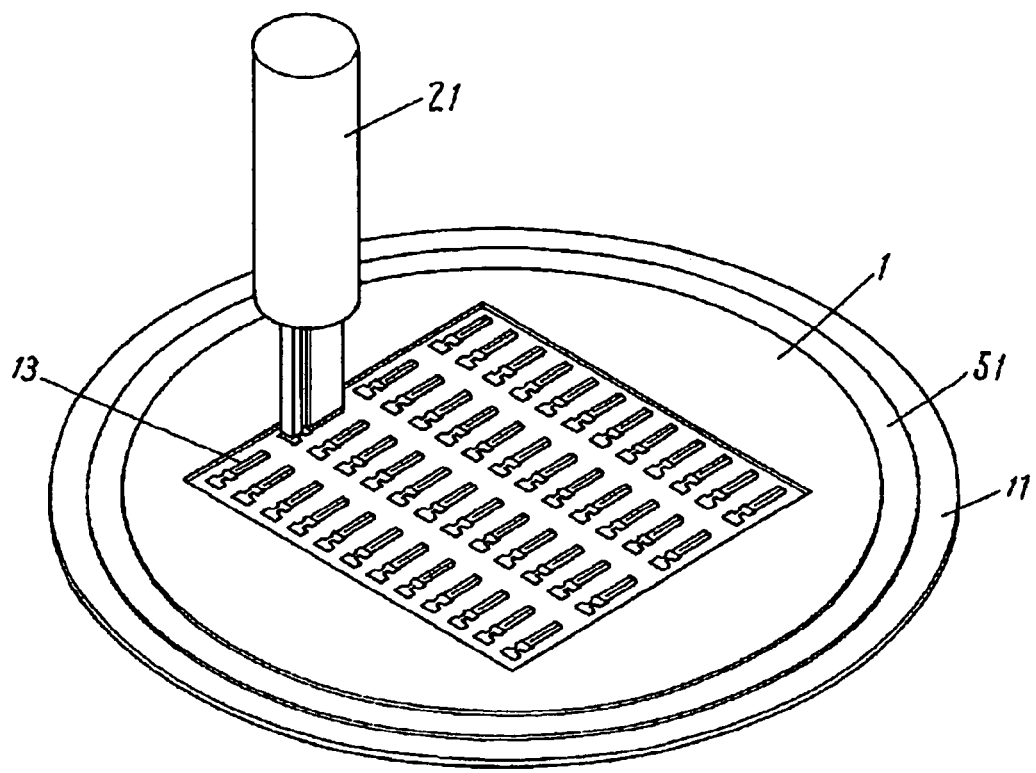
FIG. 26 is a perspective view of the sensor for showing a process of manufacturing the sensor of Embodiment 2.
Figure 27:
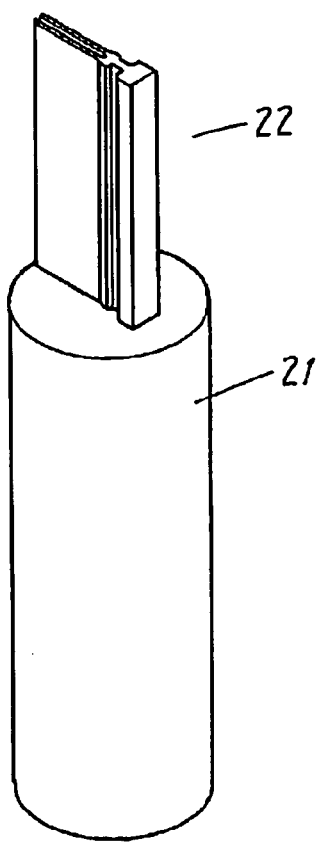
FIG. 27 is a perspective view of a heating iron for manufacturing the sensor of Embodiment 2.
Figure 28:
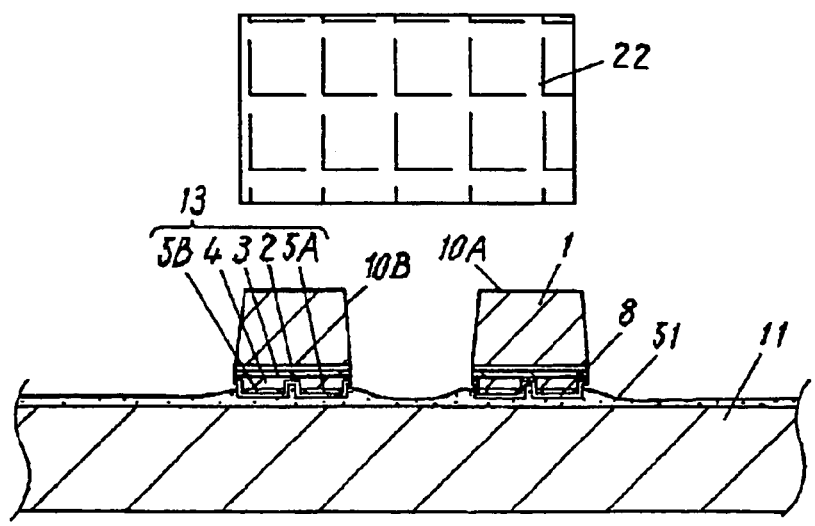
FIG. 28 is a cross sectional view of the sensor for showing a process of manufacturing the sensor of Embodiment 2.

A heating iron 21 is used for heating the electronic element 13, as shown in FIG. 26. A distal end 22 of the heating iron 21 may preferably have a shape identical to or slightly smaller than the shape of the electronic element 13, as shown in FIG. 27. Since a target electronic element 13 is joined to adjacent electronic elements 13 only by the adhesive layer 51 of the thermoplastic resin, heat from the iron 21 can hardly transmit to other elements. The adhesive layer 51 is softened by the heating of the target electronic element 13 adhered to the dummy substrate 11, as shown in FIG. 28, hence allowing the electronic element 13 to be easily picked off.

Figure 29:
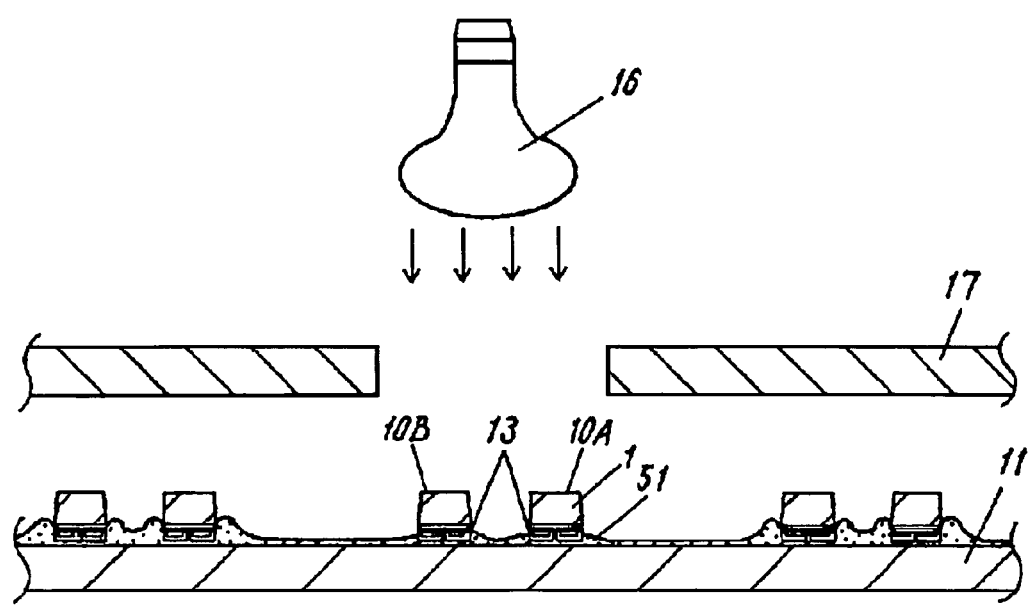
FIG. 29 is a cross sectional view of the sensor for showing a process of manufacturing the sensor of Embodiment 2.

The element may be heated by an infrared ray instead of the heating iron 15, as shown in FIG. 29. A mask 17 is provided between an infrared-ray source 16 and the dummy substrate 11 in order to allow only the target element 13 to be irradiated with the infrared ray. The infrared ray heats and softens the adhesive layer 51 around the target electronic element 13 to allow the element to be picked off easily.

Since the resist mask 8 is isolated from the adjacent electronic elements 13, similarly to that of Embodiment 1, the target electronic element 13 is adhered to the dummy substrate 11 by the adhesive layer 51 even after the substrate 1 is ground. Therefore, the target electronic device 13 is picked off from the dummy substrate 11 without disturbing the adjacent electronic elements 13, thus preventing a jumbled arrangement of the elements.

Then, the resist mask 8 is removed by organic agent or alkali solution, as shown in FIG. 16 (Step 2113 in FIG. 21). At this moment, if necessary, a remaining portion of the adhesive layer 51 may be cleaned up on the electronic device 13.

Then, the electronic element 13, i.e., the angular rate sensor 21 is accommodated in a case 14, as shown in FIG. 20 (Step 2114 in FIG. 21).

The electronic device of Embodiment 2 is not limited to the angular rate sensor but may be another device, such as a chip resistor, a chip oscillator, or a chip actuator, with the same effect as that of this embodiment.

(Exemplary Embodiment 3)

Figure 30:
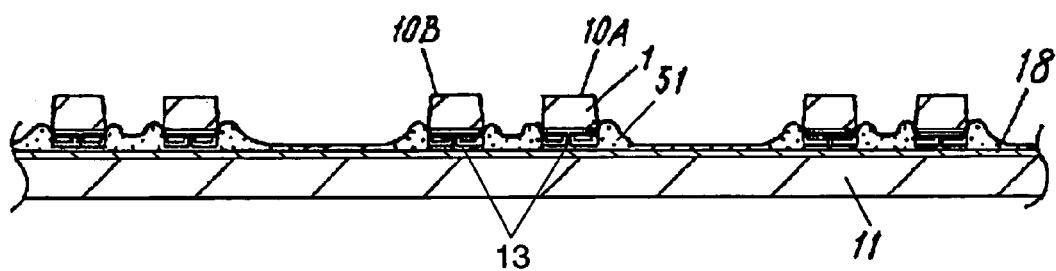
FIG. 30 is a cross sectional view of a sensor for showing a process of manufacturing the sensor according to Exemplary Embodiment 3 of the invention.
Figure 31:
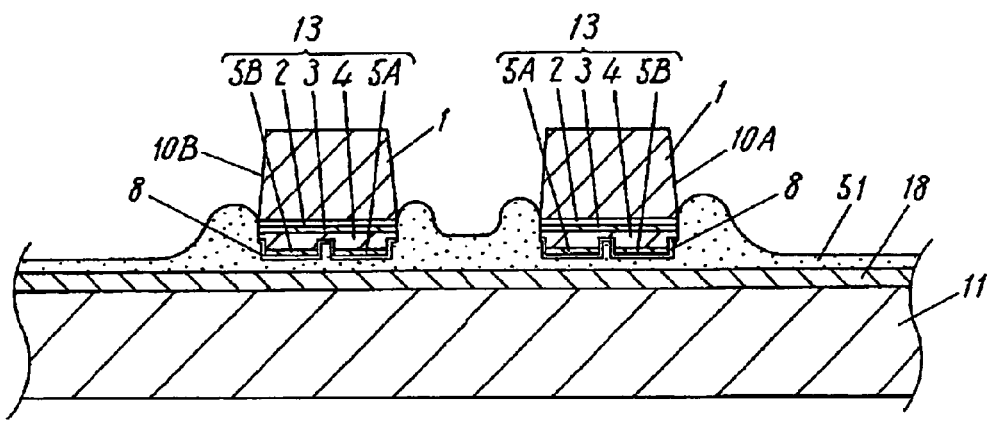
FIG. 31 is a cross sectional view of the sensor for showing a process of manufacturing the sensor of Embodiment 3.

A method of manufacturing an angular rate sensor according to Exemplary Embodiment 3 of the present invention will be described with reference to FIGS. 30 to 32. According to embodiment 3, a layer 18 made of material, such as carbon, for absorbing infrared ray is provided on a dummy substrate 11 differently from Embodiment 2. As shown in FIGS. 30 and 31, the layer 18 for absorbing infrared ray provided between the adhesive layer 51 and the dummy substrate 11 can be heated rapidly up to a high temperature upon absorbing the infrared ray, thus allowing a target electronic device 13 to be picked off efficiently.

Figure 32:
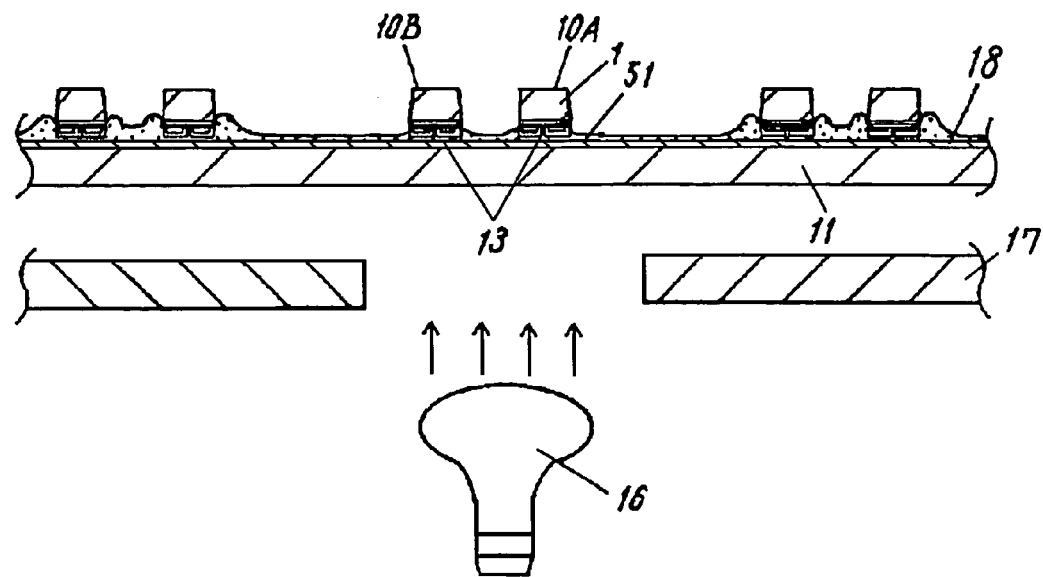
FIG. 32 is a cross sectional view of the sensor for showing a process of manufacturing the sensor of Embodiment 3.

The dummy substrate 11, upon being made of silicon or glass transmitting the infrared ray, allows the infrared ray to be irradiated from the back surface of the substrate 11 to a desired location of the adhesive layer 51 which holds the electronic device 13, as shown in FIG. 32. This can facilitate the picking of the electronic device 13. Other arrangements and materials are identical to those of Embodiment 1.

(Exemplary Embodiment 4)

A method of manufacturing a sensor according to Exemplary Embodiment 4 of the present invention will be described with reference to FIGS. 33 and 34. According to Embodiment 4, differently from Embodiment 2, an adhesive layer 52 is made of resin for decreasing an adhesive strength of the layer 52 when exposed to ultraviolet ray. The resin is used as adhesive agent for a dicing tape.

Before an electronic element 13 is picked off similarly to Embodiment 2, the element 13 is exposed to an ultraviolet ray for decreasing an adhesive strength of a portion of the adhesive layer 52 around the element 13, thus allowing the electronic element 13 to be picked off easily.

Figure 33:
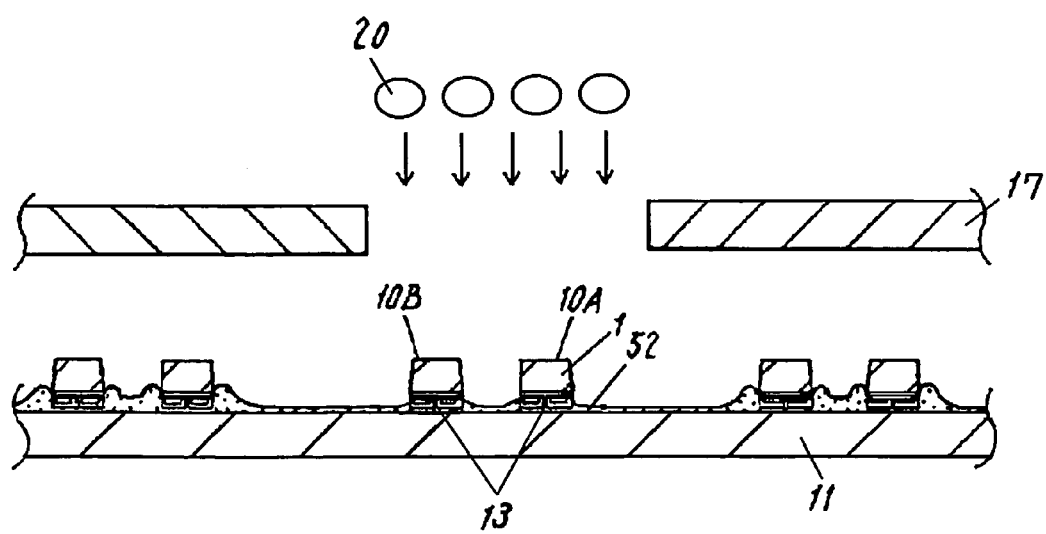
FIG. 33 is a cross sectional view of a sensor for showing a process of manufacturing the sensor according to exemplary Embodiment 4 of the invention.
Figure 34:
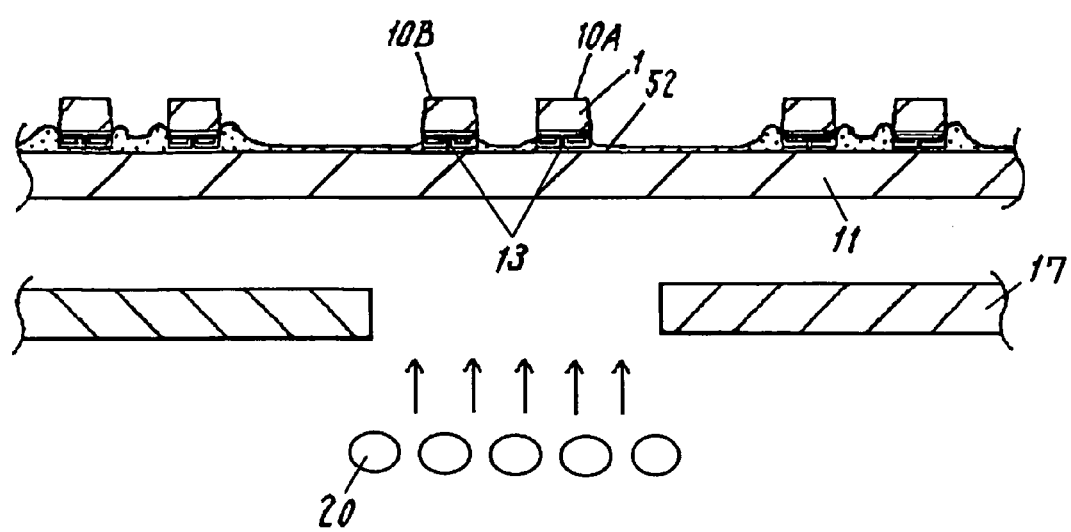
FIG. 34 is a cross sectional view of the sensor for showing a process of manufacturing the sensor of Embodiment 4.

A mask 17, similarly to Embodiment 3, may be provided between an ultraviolet ray source 20 and the electronic element 13 for allowing an ultraviolet ray to be irradiated only on a target electronic element 13, as shown in FIG. 33. If the substrate 1 is made of material which does not transmit ultraviolet ray, such as silicon, the dummy substrate 11 may be made of material that transmits an ultraviolet ray, such as silica and borosilicate glass. The substrates allow the adhesive layer 52 provided between the electronic device 13 and the dummy substrate 11 to be effectively irradiated at a necessary location with an ultraviolet ray from the back surface of the dummy substrate 11, as shown in FIG. 34. Accordingly, the electronic element 13 can be picked off easily.

The other arrangement and materials are identical to those of Embodiment 1 for manufacturing an angular rate sensor.

In order for the electronic element 13 to be picked off, the adhesive layer according to Embodiments 2 to 4 are made of the materials which can be softened by an infrared ray or ultraviolet ray. If the adhesive layer is made of material softened by physical operation, the electronic element 13 can be picked off by the operation instead of the infrared ray and the ultraviolet ray with effects identical to that of Embodiments 2 to 4. For example, the adhesive layer may be exposed to electromagnetic waves from an electronic oven.

According to Embodiments 1 to 4, the dry etching may be replaced by wet etching or any other appropriate technique for providing the recess 9 in the substrate 1 to pattern a desired electronic element.

INDUSTRIAL APPLICABILITY

In a method of manufacturing an electronic device according to the present invention, plural elements are separated at once by removing a portion of a substrate from a surface opposite to a surface having the elements provided thereon. The method allows the devices which include the elements, respectively, to be manufactured efficiently.

What is claimed is:

1. A method of manufacturing an electronic device, comprising:
   forming an element on a front surface of a substrate;
   providing a recess in the front surface of the substrate around the element;
   removing a portion of the substrate from a back surface of the substrate until reaching the recess; and
   bonding a dummy substrate to the front surface of the substrate by an adhesive layer comprising thermoplastic resin.

2. The method according to claim 1,
   wherein said providing of the recess includes
      providing a resist mask on the front surface of the substrate to be provided with the recess, and
      etching the front surface of the substrate through the resist mask,
   said method further comprising
      removing the resist mask.

3. The method according to claim 2, wherein said removing of the resist mask is executed after said removing of the portion of the substrate.

4. The method according to claim 2, wherein said etching of the front surface of the substrate includes dry-etching the front surface.

5. The method according to claim 4, wherein said dry-etching of the front surface includes dry-etching the front surface by using a first gas and a second gas.

6. The method according to claim 5, wherein the first gas contains gas for facilitating dry-etching, and the second gas contains gas for suppressing dry-etching.

7. The method according to claim 6, wherein said dry-etching of the front surface includes dry-etching the front surface by using a gas mixture including the first gas and the second gas.

8. The method according to claim 7, wherein said dry-etching of the front surface by the gas mixture includes increasing a rate of the first gas in the gas mixture according to progress of said providing of the recess in the front surface of the substrate.

9. The method according to claim 6, wherein said dry-etching of the front surface includes dry-etching the front surface by using the first gas and the second gas alternately.

10. The method according to claim 9, wherein said dry-etching of the front surface by using the first gas and the second gas alternately includes increasing a duration when the recess is provided by the first gas according to progress of said providing of the recess in the front surface of the substrate.

11. The method according to claim 4, further comprising dry-etching the substrate by using xenon difluoride.

12. The method according to claim 1, wherein the adhesive layer is provided on a surface of the element and around the element.

13. The method according to claim 1, further comprising picking off the element.

14. The method according to claim 13, further comprising mounting the element on a member.

15. The method according to claim 1, wherein the adhesive layer is provided on a surface of the element and around the element.

16. The method according to claim 1, wherein the adhesive layer is made of the thermoplastic resin.

17. The method according to claim 1, further comprising heating the element.

18. The method according to claim 17, wherein said heating of the element includes heating the element with a heating iron.

19. The method according to claim 17, wherein said heating of the element includes allowing the element to be irradiated with infrared ray.

20. The method according to claim 19, wherein a layer capable of absorbing infrared ray is provided between the dummy substrate and the adhesive layer.

21. The method according to claim 19, wherein the dummy substrate comprises silicon.

22. The method according to claim 19, wherein the dummy substrate comprises glass material which can transmit infrared ray.

23. The method according to claim 1, wherein the adhesive layer comprises resin material having adhesive strength decreased by ultraviolet ray.

24. The method according to claim 23, further comprising irradiating the adhesive layer with ultraviolet ray.

25. The method according to claim 23, wherein the dummy substrate comprises material capable of transmitting ultraviolet ray.

26. A method of manufacturing an electronic device comprising:

forming a plurality of elements on a front surface of a substrate;

providing a recess in the front surface of the substrate between the plurality of elements;

removing a portion of the substrate from a back surface of the substrate until reaching the recess;

bonding a dummy substrate to the front surface of the substrate by an adhesive layer comprising thermoplastic resin; and exposing at least one of the plurality of elements through a mask.

* * * * *